United States Patent
Bojarczuk et al.

(10) Patent No.: US 6,210,479 B1
(45) Date of Patent: Apr. 3, 2001

(54) PRODUCT AND PROCESS FOR FORMING A SEMICONDUCTOR STRUCTURE ON A HOST SUBSTRATE

(75) Inventors: Nestor A. Bojarczuk, Poughkeepsie; Supratik Guha, New City; Arunava Gupta, Valley Cottage, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/259,128

(22) Filed: Feb. 26, 1999

(51) Int. Cl.[7] ................................................. C30B 25/02
(52) U.S. Cl. .................... 117/84; 117/935; 148/DIG. 93; 148/DIG. 94
(58) Field of Search .................... 117/54, 84, 934, 117/935; 148/DIG. 93, DIG. 94; 438/458, 479, 967, 977

(56) References Cited

U.S. PATENT DOCUMENTS 5,310,446 * 5/1994 Konishi et al. ......................... 117/58
5,985,687 * 11/1999 Bowers et al. ......................... 438/46

* cited by examiner

*Primary Examiner*—Robert Kunemund
*Assistant Examiner*—Donald L. Champagne
(74) *Attorney, Agent, or Firm*—Ohlandt, Greeley, Ruggiero & Perle, L.L.P.

(57) ABSTRACT

A process for cheaply fabricating a substantially single crystal or a polycrystalline semiconductor structure on a host substrate. The process begins by depositing a layer of wide band gap nitride material 10, such as gallium nitride, aluminum nitride and/or indium nitride, on a sapphire substrate 11. The semiconductor structure 14 is then grown on the nitride layer. Next, the host substrate 15 is attached with a bonding agent to an exposed surface area of the semiconductor structure 14. The sapphire substrate is lifted off by irradiation in which nitrogen is dissociated from the nitride layer.

6 Claims, 1 Drawing Sheet

PRODUCT AND PROCESS FOR FORMING A SEMICONDUCTOR STRUCTURE ON A HOST SUBSTRATE

FIELD OF INVENTION

This invention relates to semiconductor fabricating processes and to products made by such processes. In particular, the invention relates to a process for forming a substantially single crystal semiconductor structure on a host substrate, such as glass, polymeric materials, semiconductive materials, or metal.

BACKGROUND OF INVENTION

Silicon based microelectronic drive circuits deposited on glass substrates are used extensively in the liquid crystal display. Presently, the silicon used is amorphous or near amorphous in structure. Consequently, the silicon exhibits carrier mobilities that are less than one centimeter squared per volt-second (1 $cm^2$/Vs). The problem arises because glass is an amorphous substrate. Hence, any silicon deposited on glass is either amorphous or polycrystalline. Instead, it is desirable to prepare a single crystal film of silicon on a glass substrate in an economical manner, since single crystal films have much higher carrier mobilities.

Polycrystalline silicon has low carrier mobilities because of a high density of grain boundaries that act as scattering centers. In the limiting case of very small grains, there is a consequent high degree of disorder. Single crystal, or near single crystal films, on the other hand, have either none or very few grain boundaries. Consequently, the carrier mobilities of single crystal or near single crystal silicon are very high.

There are two types of single crystal films. A first type has no grain boundaries and extended defects, such as dislocations. These films have the highest carrier mobilities and are usually found only for the case of homoepitaxy, or near homoepitaxy. The second type of single crystal films has no grain boundaries, but could possess domain boundaries and/or a high density of dislocations. These films can still have significantly high carrier mobilities, though not as high as the first type. For instance, Bean describes in Applied Physics Letters, volume no. 36, pages 741 to 743, 1980, a single crystal silicon grown on sapphire substrates, with a high lattice mismatch resulting in a very large density of dislocations. However, the carrier mobilities are on the order of 200 to 300 $cm^2$/Vs, which is two orders of magnitude higher than what can be expected from amorphous silicon.

Organic thin film-based microelectronics on flexible substrates, such as plastic, is an emerging area of research for applications such as smart cards or flexible displays. However, these materials also suffer from poor carrier mobilities of less than 1 $cm^2$/Vs. One advantage of such thin films is their ability to flex. However, if a single crystal silicon thin film can be cheaply grown or transplanted onto a plastic or polymer substrate, it will provide superior electrical properties compared to organic thin film based devices. Furthermore, silicon has excellent elastic properties so that a thin (less than a few microns) film will easily conform to a flexing substrate.

The problem essentially is how to form single crystal thin silicon films onto large area glass or plastic substrates in an economical fashion to create high mobility devices that provide a better alternative to amorphous silicon on glass or organic electronics on plastic.

Possible solutions are to either transfer or grow a high quality single crystal silicon layer onto a plastic or glass substrate. Growth of a single crystal film on an amorphous substrate is an unsolved challenge. There are different ways of transferring a silicon layer to an arbitrary substrate, most of which are uneconomical or impractical. One method is to diffusion bond a silicon wafer to the glass or plastic substrate, and then etch off the silicon from the backside to remove most of the substrate. However, this method destroys an entire silicon wafer such that a large area coating is therefore uneconomical. Another method is to perform the diffusion bonding and then, using a "smartcut" H embrittlement process, peel away silicon layers from a wafer. A single wafer is then able to supply a large amount of semiconductor real estate. However, a smartcut process requires a 600° C. anneal, which is incompatible with commonly used glass or plastic substrates.

U.S. Pat. No. 5,225,251 describes a process for coating a substrate surface with aluminum by depositing a layer of aluminum nitride on the substrate surface. The process uses a metallization step whereby the aluminum nitride is irradiated with ultraviolet radiation to dissociate the nitrogen such that a coating of aluminum remains on the substrate surface.

An article by Wong and Sands, entitled "Damage-Free Separation of GaN Films From Sapphire Substrates", Applied Physics Letters, volume no. 72, pages 599 to 601, 1998, describes the use of a metallization step for lift off or transfer from a sapphire substrate. The article starts with a structure having a gallium nitride film deposited on a sapphire substrate. A silicon wafer is then bonded with epoxy to the gallium nitride film. A metallization step is then used to lift the sapphire substrate from the gallium nitride film/silicon wafer structure.

It is an object of the present invention to resolve the problem of cheaply fabricating a substantially single crystal semiconductor on a host substrate.

It is another object of the present invention to use a metallization procedure to transfer a semiconductor structure grown on a nitride film disposed on a sapphire substrate to the host substrate.

SUMMARY OF INVENTION

The process according to the present invention forms a substantially single crystal or polycrystalline semiconductor on a host substrate. First, a layer of nitride material is deposited on a top surface of a sapphire substrate.

The layer of nitride material is comprised of one or more nitride films selected from the group of gallium nitride, aluminum nitride or indium nitride and/or their alloys. Next, one or more layers of substantially single crystal or polycrystalline semiconductor material are grown on the layer of nitride material. The layer or layers of silicon material form a semiconductor structure. Then, a composite structure is formed of the sapphire substrate, the layer of nitride material, the semiconductor structure and the host substrate. The back surface of the sapphire substrate is laser irradiated with sufficient energy to substantially dissociate enough nitrogen from the nitride material to allow the sapphire substrate to be lifted from the composite structure. The sapphire substrate is then lifted from the composite structure. Any metallic residue is removed from the composite structure.

The product according to the present invention is the product formed by the process of the present invention.

BRIEF DESCRIPTION OF DRAWINGS

Other and further objects, advantages and features of the present invention will be understood by reference to the following specification in conjunction with the accompanying drawings, in which like reference characters denote like elements of structure and.

DESCRIPTION OF PREFERRED EMBODIMENT

Figure 1:
FIG. 1 is a side elevation view of a sapphire substrate used in the process of the present invention.
Figure 2:
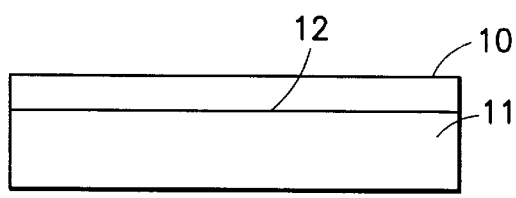
FIG. 2 is a side elevation view of an intermediate product of the process of the present invention

The process, according to the present invention, forms a substantially single crystal or polycrystalline semiconductor layer on a host substrate, at relatively low temperature. The process is non-destructive in the sense that a single sapphire substrate can be re-used consistently to transplant the semiconductor onto the host substrate.

The process is applicable to column IV semiconductors, and is especially applicable to silicon and germanium as they have the same diamond cubic crystal structure and lattice constants that are within about 4% of one another. For ease of description, the semiconductor will be referred to herein as silicon, it being understood that other column IV semiconductors can be used, especially germanium.

The host substrate can be any substrate. Preferably, the host substrate is glass, metal. a polymeric material or a semiconductive material.

With reference to FIGS. 1 through 6, a thin layer of wide band gap nitride material 10 is deposited or grown on a top surface 12 of a sapphire substrate 11. The layer of nitride material 10 is comprised of one or more layers of column III nitrides, preferably selected from the group that includes gallium nitride, aluminum nitride and indium nitride. Sapphire substrate 11 preferably has a (0001), (1, −1, 02), (11, −2, 0) or other orientation. Next, a conventional deposition process is used to deposit silicon thin film 14 to a desired thickness on nitride layer 10. Silicon grown in this fashion is substantially single crystal in nature. It is of better crystalline quality than the amorphous or polycrystalline silicon that would occur if deposited directly on a plastic or glass host substrate. At this stage of the process, conventional semiconductor fabrication can be used to form other layers or structures, designated generally on the drawing by numeral 15, to form a silicon structure 16 for a microelectronic circuit.

Figure 3:
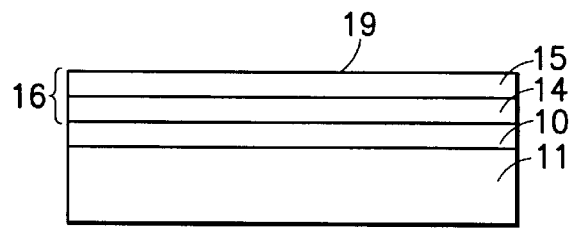
FIG. 3 is a side elevation view of another intermediate product of the process of the present invention.
Figure 4:
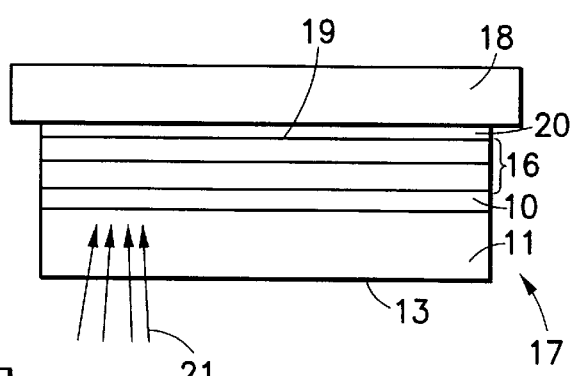
FIG. 4 is a side elevation view of another intermediate product of the process of the present invention.

Referring to FIGS. 3 and 4, a composite structure 17 is next formed with sapphire substrate 11, nitride layer 10, silicon structure 16 and a host substrate 18. In particular, the top most or exposed surface 19 of silicon structure 16 is attached to host substrate 18, using an adhesive or bonding agent, such as epoxy or a soft metal 20.

Next, bottom surface 13 of sapphire substrate 11 is irradiated with energy 21 (FIG. 4). Preferably, energy 21 is produced by a laser and has a fluence of about a few hundred milli Joules per square centimeter (mJ/cm$^2$), or more, as delivered by nanosecond duration pulses. The laser irradiation system can be configured for rastering over large areas for large area metallization and transplanting. The photon energy 21 is around or higher than the band gap of nitride layer 10.

Figure 5:
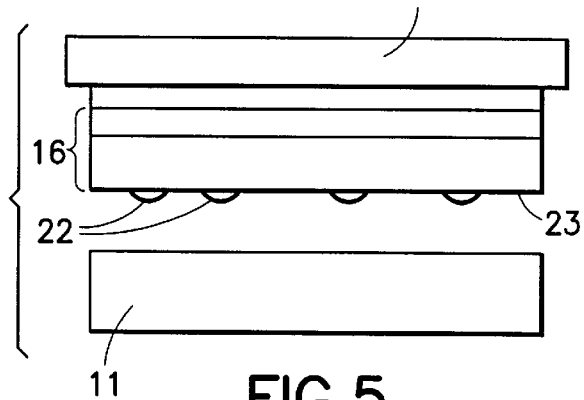
FIG. 5 is a side elevation view of another intermediate product of the process of the present invention.

The photon energy 21 passes with minimal absorption through transparent sapphire substrate 11. The photon energy 21 is absorbed in nitride layer 10 within a depth of about 150 nanometers (nm) of the sapphire/nitride interface for 248 nm excimer laser radiation to cause a metallization reaction that substantially dissociates nitrogen from the column III metal. This dissociation allows sapphire substrate 11 to be lifted from silicon structure 16 (attached to host substrate 18 as shown in FIG. 5). If necessary, the composite structure 17 may be heated slightly, as on a hot plate, to soften the gallium, aluminum and/or indium metal enough to separate sapphire substrate 11. In this fashion single crystal silicon film 14 is easily transferred onto a plastic or glass substrate 18.

As shown in FIG. 5, metallic residue 22 from nitride layer 10 remains on a bottom surface 23 of silicon film 14. Residue 22, for example, gallium, aluminum and/or indium, may be removed and known method, such as by dipping composite structure 17 in a bath of acid, for example in a hydrochloric acid and nitric acid mixture.

Because the process steps involved with attaching host substrate 18 to silicon structure 16 and with lift off of sapphire substrate 11 do not subject host substrate 18 to temperatures that appreciably deviate from room temperature, a wide variety of materials can be used for host substrate 18. Preferably, host substrate 18 is made of glass, polymeric materials, semiconductive materials, or metal.

If the thickness of nitride layer 10 is greater than the energy absorption depth of about 150 nm, the residue 22 will also include some unmetallized nitride. If necessary, this residual nitride is removed by polishing, for example, mechanical touch polishing or chemical mechanical polishing.

After the transplanting operation, sapphire substrate 11 can be prepared for reuse by etching off any residual Ga, Al, or In on surface 12. This is possible due to the highly inert and robust nature of sapphire. Consequently, it is easy to define a process where single crystal silicon layers can be easily transplanted onto large area glass or plastic substrates in a parallel, cheap, fashion using reusable sapphire substrates as templates.

Single crystal film 14 is highly defective due to the lattice mismatch between silicon and nitride layer 10. However, it is expected that the carrier mobilities will be about in the 50–500 cm$^2$/Vs range.

Figure 6:
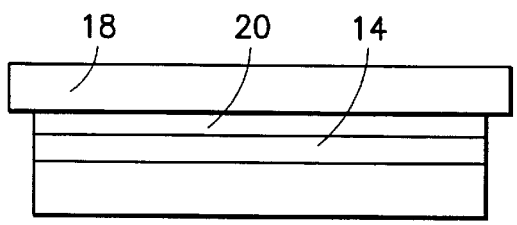
FIG. 6 is a side elevation view of the finished product of the process of the present invention.

The product produced by the process is shown in FIG. 6 as having single crystal silicon film 14 attached by bonding agent 20 to insulative host substrate 18. This product is superior in performance to prior art that employed polycrystalline silicon or other semiconductor material on an insulative host substrate such as glass.

An actual example of the process was constructed using germanium (Ge) instead of silicon as a test semiconductor material. A c-axis oriented (0001) sapphire substrate was loaded onto a molecular beam epitaxy system. Next, a nitride buffer layer of aluminum nitride (AlN) was grown following standard procedures. The sapphire substrate was heated to about 800° C. and approximately 40 nm of AlN deposited. The temperature was kept between 700 to 750° C., while 60 to 100 nm of gallium nitride (GaN) was deposited on the AlN layer. (Alternately, the sapphire substrate could be heated to 520° C. and a GaN layer grown to a thickness of about 50–100 nm, followed by raising the temperature to 750° C. and continuing the GaN growth for another 50–900 nm.) In this fashion, nitride layers with a total thickness in the range of 100 to 1000 nm were deposited on the sapphire substrate. This example used an (0001) oriented sapphire substrate. However, (1, −1, 02) or other oriented wafers could have been used as well.

The nitride/sapphire substrate was then transported to a Ge deposition system (either in vacuo or exposed to atmosphere). Since GaN and AlN are extremely inert, the layers can be handled in air and reinserted into the deposition chamber without compromising the nitride surface quality.

Then, the sapphire substrate was heated to about 700° C. and a Ge layer deposited, with the Ge cell held at about 1200° C. for a Ge deposition rate of about 100 nm per hour. The Ge growth was single crystal or multi-domain in nature as evidenced by a clear reconstructed Ge reflection electron diffraction pattern. Following growth of a Ge layer of about 1 micron thickness, the composite sample was removed from the vacuum system.

The sapphire substrate was then prepared for debonding. First, the sapphire substrate bottom surface was polished to optical smoothness with diamond polishing paper. This step may be skipped if the sapphire substrate bottom is already polished. Next the sapphire substrate was mounted face down (i.e., the Ge surface facing down) onto a host substrate. For the example, the host substrate was a 50 nm silicon dioxide layer grown on a silicon wafer. The mounting used a standard commercial 5 minute epoxy procedure.

The bottom surface of the sapphire substrate was then irradiated with a 248 nm excimer laser, using nanosecond pulses at a fluence of about a few hundred mJ/cm$^2$. The irradiated area had approximate dimensions of about 5 mm×5 mm. The metallization reaction of the nitride/sapphire interface was clearly observed. The composite structure was then lightly warmed on a hot plate to about 50° C. and the sapphire substrate was easily removed. In this fashion, the Ge layer with the overlying and remaining unmetallized GaN layer was left intact on the host substrate. The Ge layer was about 30 nm thick, while the GaN layer was about 1 micron thick.

Thinner GaN layers may be used for convenience. If the layers are about 150 nm or less, the entire GaN layer is expected to be metallized. On the other hand, if the GaN layer is thicker than about 150 nm, some GaN will remain on the Ge layer. In either case, the excess metallic Ga can be etched off as by dipping in a hydrochloric acid bath and the GaN can polished off to leave a clean transplanted Ge surface. The same can be done to the sapphire substrate to prepare it for a subsequent growth.

It is important that the bottom surface of the sapphire be optically clear. If there are scratches, metallization may be incomplete due to scattering of the irradiated laser light with the result that scratches are replicated on the transplanted surface, possibly because the scratches contain areas of unmetalized GaN.

The present invention having been thus described with particular reference to the preferred forms thereof, it will be obvious that various changes and modifications may be made therein without departing from the spirit and scope of the present invention as defined in the appended claims.

What is claimed is:

1. A process of forming a substantially single crystal or polycrystalline semiconductor on a host substrate, said process comprising:

depositing on a first surface of a sapphire substrate, a layer of nitride material comprised of one or more nitride films selected from the group consisting of gallium nitride, aluminum nitride, indium nitride and their alloys;

growing one or more layers of semiconductor material on said nitride material, said layer or layers of semiconductor material forming a semiconductor structure;

forming a composite structure comprised of said sapphire substrate, said nitride material, said semiconductor structure and a host substrate;

irradiating a second surface of said sapphire substrate that is opposed to said first surface, with sufficient energy to substantially dissociate enough nitrogen from the nitride material to allow said sapphire substrate to be lifted from said composite structure;

lifting said sapphire substrate from said composite structure; and removing any metallic residue from said composite structure.

2. The process according to claim 1, wherein said composite structure is formed by attaching an exposed surface of said semiconductor structure to said host substrate.

3. The process according to claim 2 wherein said exposed surface is attached with a bonding agent to said host substrate.

4. The process according to claim 3, wherein said host substrate is formed of a glass or a polymeric material.

5. The process according to claim 4, wherein said host substrate is formed of a semiconductive material.

6. The process according to claim 1, wherein said semiconductor structure is subjected to fabrication procedures to form semiconductive devices therein.

\* \* \* \* \*